United States Patent [19]

Krisst

[11] 4,071,818
[45] Jan. 31, 1978

[54] MAGNETOSTRICTIVE POSITION INDICATOR

[75] Inventor: Raymond J. Krisst, West Hartford, Conn.

[73] Assignee: Combustion Engineering, Inc., Windsor, Conn.

[21] Appl. No.: 628,043

[22] Filed: Nov. 3, 1975

[51] Int. Cl.² .......................................... G01R 33/00
[52] U.S. Cl. .................. 324/208; 333/30 M; 324/219; 324/225
[58] Field of Search ............... 324/34 PS, 34 L, 34 D, 324/34 R, 34 MA; 333/30 M; 340/188 R

[56] References Cited

U.S. PATENT DOCUMENTS

| 2,401,094 | 5/1946 | Nicholson, Jr. | 324/34 MA |
| 3,423,673 | 1/1969 | Bailey et al. | 324/34 R |
| 3,594,740 | 7/1971 | Comeau et al. | 340/188 |
| 3,898,555 | 8/1975 | Tellerman | 324/34 D |

FOREIGN PATENT DOCUMENTS 896,714  5/1962  United Kingdom .............. 333/30 M Primary Examiner—Stanley T. Krawczewicz

[57] ABSTRACT

The position of a movable member is measured without the establishment of physical contact with such member. A magnetic field generator, which provides a localized field of special geometry, is mounted on the movable member and an elongated ferromagnetic member is positioned adjacent and parallel to the path of movement of the member. The magnetic field will produce a change in the Young's modulus of elasticity in an adjacent region of the ferromagnetic member and sonic strain pulses launched along the ferromagnetic member will be partly reflected from this region of Young's modulus discontinuity. The time required for a strain pulse to travel from a given point on the ferromagnetic member to the region of Young's modulus discontinuity and be partially reflected therefrom and returned to a known detection point will provide a measure of the position of the field generator along the elongated ferromagnetic member.

15 Claims, 3 Drawing Figures

U.S. Patent    Jan. 31, 1978    4,071,818
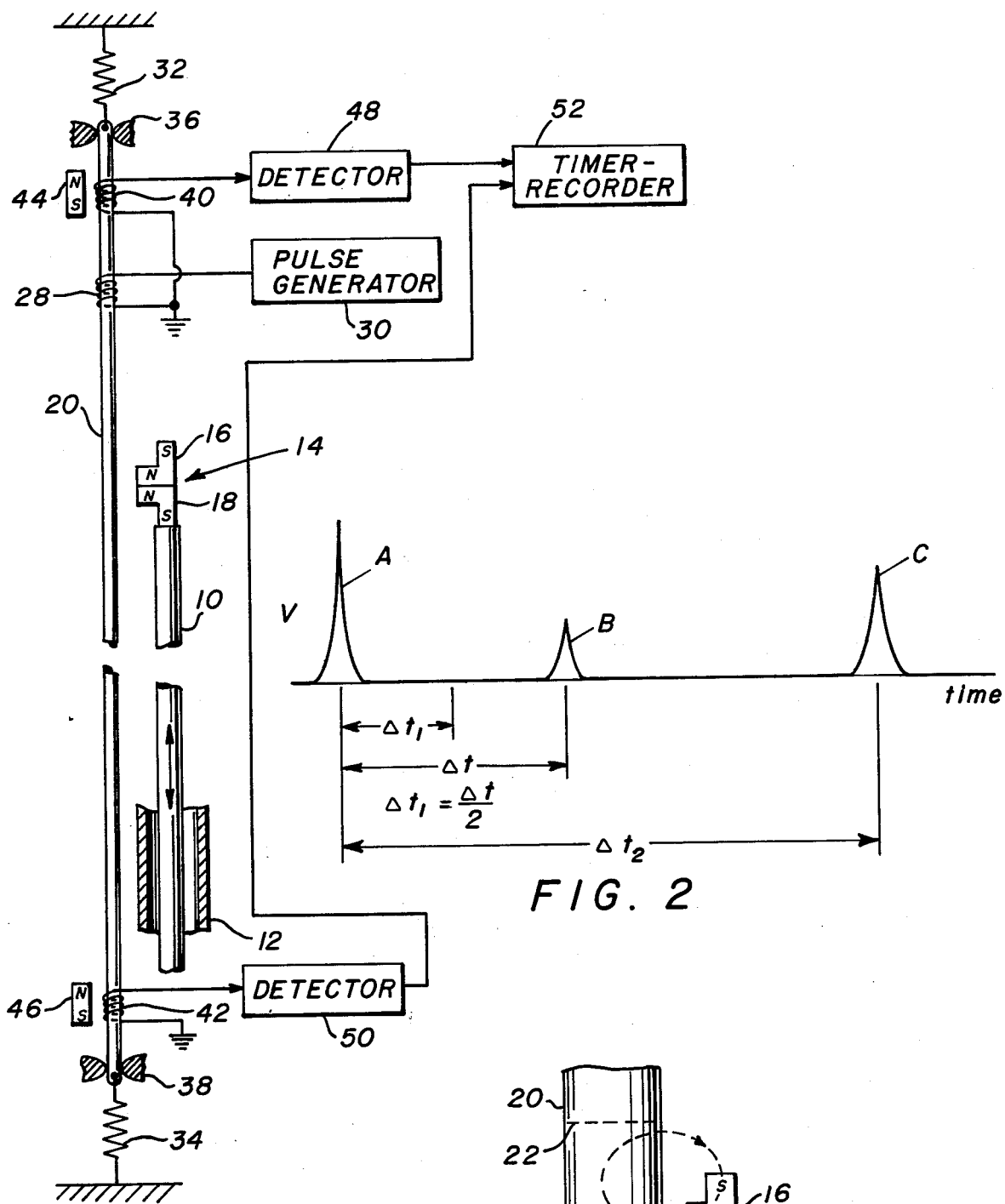
FIG. 1
FIG. 2
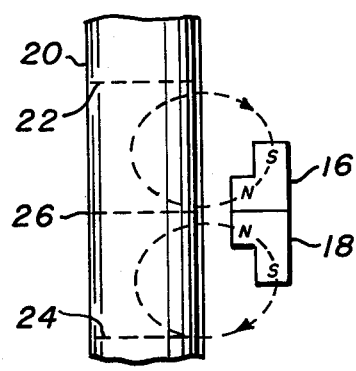
FIG. 3

MAGNETOSTRICTIVE POSITION INDICATOR

BACKGROUND OF THE INVENTION

1. Field of the Invention

The present invention relates to the providing of an indication of the position of a movable member. More particularly, this invention is directed to apparatus for indicating the position of a movable member, for example a member which moves within a hermetically sealed enclosure without establishing pyhsical contact with such member and without requiring penetration of the wall of the enclosure. Accordingly, the general objects of the present invention are to provide new and improved methods and apparatus of such character.

2. Description of the Prior Art

While not limited thereto in its utility, the present invention is particularly well suited to the monitoring of the position of a control rod in a nuclear reactor. As is well known, in the interest of preventing leakage of primary loop coolant, portions of the structure of a nuclear reactor are sealed to the environment. Additionally, to minimize the possibility of exposing operating personnel to dangerous amounts of radiation, reactor control and particularly control rod positioning is commanded from a remotely located, central control station. In conventional practice with pressurized water type reactors, the reactor control rods are positioned within sealed housings which internally communicate with and extend from the reactor pressure vessel. Obviously, an important design requirement for a nuclear reactor is that the points of communication between the exterior and the interior of the pressure vessel, either directly or through the control rod housings, be minimized thereby minimizing potential leakage of pressure vessel coolant which, of course, is contaminated by radiation.

To further discuss the problem of control rod position monitoring as an example utilization of the present invention, a hermetically sealed control rod drive, which may either be hydraulic or include a drive motor, is to be preferred. However, with a hermetically sealed drive there is nothing extending out of the control rod housing or pressure vessel to provide an indication of where the rod is instantaneously positioned. With hermetically sealed drives, as well as in installations where a drive motor is pcsitioned externally of the control rod housing and communicates with the rod drive through specially designed shaft seals, control rod position can not be accurately monitored without providing for the passage of a plurality of electrical conductors through the housing; such conductors providing communication between position sensing devices mounted on the control rod or its drive mechanism and the ambient atmosphere externally of the pressurized system. Additionally, the monitoring of control rod position in a nuclear reactor is further complicated by the fact that the control rod is typically submerged in the reactor coolant and, during operation of the reactor, the temperature of this fluid and thus of the rod itself becomes quite high. The design of position monitoring apparatus is thus complicated by the facts that, if portions thereof are to be physically affixed or connected to the control rod as has been past practice, such portions of the position indicating apparatus must be capable of withstanding high temperatures and must be able to operate while submerged in a fluid such as water.

Because of the above briefly discussed design requirements dictated by the operating environment and safety considerations, control rod position monitoring apparatus has previously employed mechanical or electromechanical components which were suitable for use within a control rod housing. The requirement for use of such mechanical or electromechanical components has, in turn, limited the flexibility of the design and in most cases required undesirable communication between the interior and the exterior of the control rod housing. As will be obvious to those skilled in the art, any failure of rod position sensing devices which would require a maintenance procedure would, with the failed component or components located within the pressurized system, necessitate a lengthy shut-down of the reactor.

In an attempt to overcome the problems incident to the use of position monitoring apparatus located either wholly or in part within the control rod housing or reactor pressure vessel, it has been proposed to mount radiation sources or magnetic field generators on the control rods or their drives and to position suitable radiation or field detecting devices on the exterior of the control rod housing. An example of a control rod position monitoring apparatus wherein magnetic field producing elements are mounted on the control rod drive may be found in U.S. Pat. No. 3,594,740 to J. Comeau and W. Zinn. While apparatus such as that disclosed in U.S. Pat. No. 3,594,740 overcomes many of the problems of prior art position sensors of the type which require some means for providing communication through the wall of the control rod housing, the patented device nevertheless possesses certain deficiencies. The principal one of these deficiencies is the large number of components, particularly the field sensing devices located externally of the control rod housing, required to obtain the desired accuracy. As is well known, the cost of fabrication and installation of a device is usually directly proportional to the number of components while reliability is usually inversely proportional to the number of components. Thus, to briefly summarize, those prior art devices for providing an indication of the position of a movable member which were suitable for use with nuclear reactor control rods have possessed the undesirable characteristics of either requiring sensing elements positioned within the control rod housing with the concurrent requirement for establishment of communication to such sensor elements through the wall of the housing and/or have required a substantial number of components with the corresponding inherent decrease in reliability and increase in cost.

SUMMARY OF THE INVENTION

The present invention overcomes the above briefly discussed and other deficiencies and disadvantages of the prior art by providing a novel and improved method which enables the position of a movable member, such as a nuclear reactor control rod, to be accurately monitored without the necessity of providing communication between the interior and exterior of the housing in which the movable member is situated. The present invention further encompasses apparatus for use in the practice of the aforesaid method which apparatus is characterized by utilization of components, minimal in number, which are not readily susceptible to damage or failure in normal use. The apparatus and method of this invention are further characterized by the ability to provide highly accurate position information without the establishment of any physical contact with the movable member of interest.

The operation of the present invention is based upon magnetostrictive effect whereby a longitudinal sonic pulse is generated in a ferromagnetic strip or wire and at least partially reflected from a region on the wire where a localized external magnetic field of special geometry has produced a change in the Young's modulus of elasticity of the wire. Thus, in accordance with the invention, an elongated ferromagnetic element is oriented parallel to the path of movement of the member whose position is to be monitored. The movable member is provided, at a predetermined position thereon, with means for generating a localized magnetic field which will be of proper orientation and sufficient strength to intersect the ferromagnetic wire and to produce a change in the Young's modulus of elasticity thereof. In operation of the invention a sonic pulse is produced in the ferromagnetic wire and this pulse will, in traveling along the wire, be at least partially reflected from the region where the localized magnetic field has produced a change in the Young's modulus of elasticity of the wire. The reflected sonic pulse is detected by an inverse magnetostrictive effect and the time delay between generation of the pulse and detection of the reflection will provide information as to the position of a magnetic field generator. The transmitted pulse will normally continue along the wire to point where it is also detected by means of the inverse magnetostrictive effect. The position of the two detectors being known, the times between the propagation of the initial pulse and the detection of both the partially reflected and initial pulses will provide a highly accurate indication of the position along the wire of the region of abnormality in the Young's modulus of elasticity; this position being that of the magnetic field generator attached to the movable member.

Brief Description of the Drawing

The present invention may be better understood and its numerous objects and advantages will become apparent to those skilled in the art by reference to the accompanying drawing wherein:

FIG. 1 is a schematic representation of a preferred embodiment of the present invention;

FIG. 2 is a representation of a timing diagram which depicts operation of the embodiment of FIG. 1; and FIG. 3 is a schematic representation of the region of interaction between the magnetic field generator affixed to the movable member and the ferromagnetic element of the position detector of FIG. 1.

DESCRIPTION OF THE PREFERRED EMBODIMENT

With reference now to the drawing, and particularly to FIG. 1, a movable member, which could be a nuclear reactor control rod or control rod extension, is indicated at 10. Member 10, if a reactor control rod or rod extension, would be positioned within a housing; a portion of such a housing being indicated at 12. Housing 12 would, of course, be comprised of a non-magnetic material. Member 10 is capable of linear movement, in a vertical direction, and is provided at a first end with a magnetic field generator indicated generally at 14. It will be understood that the field generator 14 could be located at some position along movable member 10 other than the upper end thereof as shown.

The magnetic field generator 14 comprises, in the disclosed embodiment, a pair of L-shaped permanent dipole magnets 16 and 18 which define a magnet doublet. Magnets 16 and 18, as may be seen from FIG. 3, cooperate to produce a magnetic field having the requisite strength and geometry to cause a change, as will be discussed in greater detail below, in the Young's modulus of elasticity of a portion of an adjacent ferromagnetic member 20; member 20 being comprised of a material such as nickel or a nickel-iron alloy which displays magnetostrictive properties and magnetic strain sensitivity.

The present invention relies for operation on the phenomenon that a localized external magnetic field having appropriate geometry will produce a change in the Young's modulus of elasticity of a ferromagnetic member exposed to such field. As represented in FIG. 3, the magnetic field produced by generator 14 induces a pair of spatially displaced regions 22 and 24 of maximum change in the Young's modulus in member 20. There is also produced, intermediate regions or zones 22 and 24, a region 26 of minimum change in the Young's modulus; the area of largest Young's modulus discontinuity thus being in the region 26 of field minimum. As should now be obvious, for proper operation of the invention it is essential that the magnetic field generator 14 produce a field having a sharply defined discontinuity.

Continuing with a description of FIG. 1, the ferromagnetic member 20 may be in the form of an elongated strip or wire which is oriented parallel to the direction of motion of member 10. Adjacent a first end thereof, the ferromagnetic wire 20 passes through an induction coil 28 which is coupled to a pulse generator 30. Application of a current pulse from generator 30 to transmitter coil 28 will result in the launching of a sonic strain pulse along the ferromagnetic wire 20. The sonic strain pulse travels along the ferromagnetic member at a speed which is a function of the sonic velocity of the material comprising member 20. The sonic strain pulse results from a sudden change of the magnetic domains in a short length of the magnetostrictive material comprising wire 20; this sudden change being caused by the external magnetic field generated as a consequence of the current pulse delivered to coil 28. Restated, the change in magnetic field resulting from current flow through coil 28 causes a change in the length of the magnetostrictive material exposed to the variable magnetic field and thus results in the generation of a sonic strain pulse.

The ferromagnetic member or wire 20 is "soft" mounted at at least one end. The "soft" mounting improves the accuracy of the read-out system, which will be described below, by absorbing mechanical energy thus improving the signal-to-noise ratio of the system. Thus, by way of example, the provision of soft mounting at both ends of member 20, as shown in FIG. 1, minimizes the reflection of the sonic pulses launched along member 20 as the result of the delivery of a current pulse to coil 28. As shown in FIG. 1, the soft mounting is accomplished by suspending member 20 between a pair of springs 32 and 34 with the opposite ends of member 20 passing between or through supporting members, as indicated at 36 and 38, comprised of a non-metallic elastic material. The supporting members 36 and 38 may, for example, be in the form of sleeves which pass about member 20.

The detection system of the present invention comprises one, and preferably two, pick-up coils as indicated at 40 and 42. The position of coils 40 and 42 will, of course, be known and such positioning will bear a known relationship to the range of excursion of member 10. The pick-up coils 40 and 42 are respectively provided with bias magnets 44 and 46 that magnetize a short length of the ferromagnetic wire 20. When the strain pulse launched from the vicinity of transmitter coil 28 arrives at the pick-up coils, the magnetized regions of the ferromagnetic wire 20 will, as a result of reverse magnetostrictive effect, undergo a time dependant change as a result of the sensitivity to strain of the ferromagnetic material. This time dependant field will induce a voltage in the pick-up coils. The voltages induced in pick-up coils 40 and 42 are respectively coupled to detectors 48 and 50. The detectors 48 and 50 may, for example, comprise amplifiers, suitable pulse shaping circuitry and/or a pulse generator such as a monostable multivibrator whereby the output of the detectors will be sharply defined pulses commensurate with the arrival at the pick-up coils of a sonic strain pulse.

It is to be noted that the transmitter coil 28 and pick-up coil 40 are shown in FIG. 1 as being spaced apart by a substantial distance. In actual practice, coils 28 and 40 will be closely positioned whereby, in the manner to be described below, a signal will be induced in coil 40 substantially simultaneously with the pulsing of coil 28. This initial signal induced in coil 40 may be employed as a reference pulse.

The output signals or pulses from detectors 48 and 50 are applied to a timer-recorder 52 which, in a manner known in the art and in accordance with the technique to be described below, counts the time delay between receipt of the reference pulse and further pulses received from detectors 48 and 50.

Referring now jointly to FIGS. 1, 2 and 3, it is initially to be noted that the signal waveforms shown in FIG. 2 are schematic in nature and are intended to respresent the timing of the various signals received at pick-up coils 40 and 42 rather than the actual shape of such signals. The reference pulse, induced in pick-up coil 40 simultaneously with or immediately after the pulsing of transmitter coil 28, is indicated at A. The sonic pulse launched along ferromagnetic member 20 at a time corresponding to the reference pulse A will be partly reflected from regions of field discontinuity in member 20; i.e., from the regions in member 20 where the proximity of field generator 14 has resulted in a change in the Young's modulus of elasticity; and the partly reflected sonic pulse will be returned to pick-up coil 40 where it will be detected as indicated at B on FIG. 2. There will, of course, be partial reflections from each of the regions of maximum field discontinuity as indicated at 22, 24 and 26 in FIG. 3. The principal or major reflection, however, will be from region 26 and this principal reflection will either be filtered out in detector 48 or both detectors will include means for averaging received signals. The sonic pulse will continue along member 20 and will result in a signal being induced in pick-up coil 42. This signal is indicated at C on FIG. 2. The ratio of the times $\Delta t_1/\Delta t_2$ multiplied by the length of the wire as defined by the position of the pick-up coils will indicate the position of the magnetic doublet or field generator 14. While the position of the generator 14 can be determined merely from the time $\Delta t$; i.e., the time between launching and receipt of the partially reflected sonic pulse; greater accuracy is obtained employing both pick-up devices since the use of the $\Delta t_2$ time provides inherent correction for factors such as temperature induced changes in the length of the ferromagnetic wire 20.

To summarize the present invention, the position of a movable member is determined by a technique which includes sensing the reflection of a sonic pulse from a point where a discontinuity in the Young's modulus of a ferromagnetic member has been produced. The Young's modulus discontinuity is produced through use of a magnetic field generator or magnetic doublet which provides a magnetic field geometry characterized by a field minimum which results in an effective localized perturbation of the ferromagnetic member.

While a preferred embodiment has been shown and described, various modifications and substitutions may be made thereto without departing from the spirit and scope of the invention. Thus, by way of example, the position measurement system of the present invention may be made redundant by the use of a plurality of ferromagnetic wire sensors and associated circuitry placed about either the periphery of the movable member or the housing in which such movable member travels. Accordingly, it will be understood that the present invention has been described by way of illustration and not limitation.

What is claimed is:

1. Apparatus for indicating the position of a movable member without establishing contact with such member comprising:

a magnetic field generator mounted on the movable member for movement therewith;

an elongated ferromagnetic member;

means mounting said ferromagnetic member adjacent to and spaced from the movable member, said ferromagnetic member extending parallel to the direction of movement of the movable member whereby the spacing between said field generator and said ferromagnetic member will remain substantially constant during movements of the movable member and the field emanating from said magnetic field generator will induce a localized region of discontinuity in the Young's modulus of elasticity of said ferromagnetic member;

means for inducing a sonic strain pulse in said ferromagnetic member, said sonic strain pulse inducing means being fixed in position with respect to both of said ferromagnetic and movable members, sonic strain pulses from said inducing means traveling along said ferromagnetic member and being at least partly reflected from said region of Young's modulus discontinuity;

first sonic strain pulse detector means fixedly mounted along said ferromagnetic member in proximity to said inducing means, said first detector means providing an output signal commensurate with the arrival at said first detector means of a sonic strain pulse reflected from the region of Young's modulus discontinuity in said ferromagnetic member; and means connected to said first detector means and responsive to signals provided thereby for providing an output signal commensurate with the time required for a sonic strain pulse to travel along said ferromagnetic member from said sonic pulse inducing means to said region of Young's modulus discontinuity and for a reflected pulse to travel to said first detector means, said time being an indication of the position along said ferromagnetic member of said magnetic field generator.

2. The apparatus of claim 1 wherein said magnetic field generator comprises:
   a magnetic doublet including a pair of dipole magnets, said dipole magnets being arranged with first like poles in juxtapositioned relationship and adjacent said elongated ferromagnetic member.

3. The method of claim 2 wherein said dipole magnets of said magnetic field generator are L-shaped permanent magnets.

4. The method of claim 1 wherein said means for mounting said ferromagnetic member comprises:
   means resiliently supporting at least one end of said ferromagnetic member whereby mechanical vibrations induced in said elongated member may be absorbed at at least a first end thereof.

5. The method of claim 4 wherein said mounting means further comprises:
   means for resiliently supporting the second end of said elongated ferromagnetic member.

6. The method of claim 1 further comprising:
   second sonic strain pulse detector means, said second detector means being positioned along said ferromagnetic member so as to receive and generate an output signal commensurate with the arrival at said second detector means of the sonic strain pulse from said inducing means, said second detector means being positioned at the opposite side of said region of Young's modulus discontinuity in said elongated member from said first detector means.

7. The apparatus of claim 6 wherein said first and second detector means each comprise:
   a permanent magnet; and
   a pick-up coil positioned adjacent said permanent magnet and inductively coupled to said elongated ferromagnetic member, a time dependent magnetic field change being produced in the vicinity of said pick-up coil by a sonic strain pulse whereby said pick-up coil will have a current induced therein.

8. The apparatus of claim 6 wherein the signal generated by said second detector means is delivered to said output signal providing means whereby said position indicating apparatus is self-compensating for temperature induced variations in the length of said ferromagnetic member.

9. The method of claim 6 wherein said means for mounting said ferromagnetic member comprises:
   means resiliently supporting at least one end of said ferromagnetic member whereby mechanical vibrations induced in said elongated member may be absorbed at at least a first end thereof.

10. The apparatus of claim 9 wherein said magnetic field generator comprises:
    a magnetic doublet including a pair of dipole magnets, said dipole magnets being arranged with first like poles in juxtapositioned relationship and adjacent said elongated ferromagnetic member.

11. The apparatus of claim 10 wherein said first and second detector means each comprise:
    a permanent magnet; and
    a pick-up coil positioned adjacent said permanent magnet and inductively coupled to said elongated ferromagnetic member, a time dependent magnetic field change being produced in the vicinity of said pick-up coil by a sonic strain pulse whereby said pick-up coil will have a current induced therein.

12. The apparatus of claim 11 wherein the signal generated by said second detector means is delivered to said output signal providing means whereby said position indicating apparatus is self-compensating for temperature induced variations in the length of said ferromagnetic member.

13. The method of claim 12 wherein said mounting means further comprises:
    means for resiliently supporting the second end of said elongated ferromagnetic member.

14. A method for detecting the position of a movable member without establishing contact therewith comprising the steps of:
    locating a magnetic field generator on said movable member for movement therewith;
    positioning an elongated ferromagnetic member adjacent and parallel to the path of movement of the movable member whereby the magnetic field generator will produce a change in the Young's modulus of elasticity in an adjacent region of the ferromagnetic member;
    launching a sonic strain pulse along the ferromagnetic member; and
    measuring the time required for the launched sonic strain pulse to travel along the member to the region of Young's modulus discontinuity and for a reflected strain pulse to return to a preselected point, said measured time being an indication of the position of the magnetic field generator on the movable member relative to the given point.

15. The method of claim 14 further comprising the step of:
    measuring the transmission time of a launched sonic strain pulse to a second point along the ferromagnetic member positioned to the opposite side of the Young's modulus discontinuity region from said first given point.

* * * * *